(12) United States Patent
Han

(10) Patent No.: US 9,591,190 B2
(45) Date of Patent: Mar. 7, 2017

(54) CAMERA HAVING A MOLDING UNIT INTEGRATING PARTS AND METHOD FOR MANUFACTURING THE SAME

(75) Inventor: Sangyeal Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 547 days.

(21) Appl. No.: 13/883,447

(22) PCT Filed: Aug. 5, 2011

(86) PCT No.: PCT/KR2011/005738
§ 371 (c)(1),
(2), (4) Date: May 3, 2013

(87) PCT Pub. No.: WO2012/060542
PCT Pub. Date: May 10, 2012

(65) Prior Publication Data
US 2013/0222596 A1     Aug. 29, 2013

(30) Foreign Application Priority Data
Nov. 3, 2010 (KR) .................. 10-2010-0108497

(51) Int. Cl.
*H04N 5/225* (2006.01)
*G03B 17/08* (2006.01)

(52) U.S. Cl.
CPC .......... *H04N 5/2254* (2013.01); *G03B 17/08* (2013.01); *H04N 5/2252* (2013.01); *H04N 5/2257* (2013.01)

(58) Field of Classification Search
CPC ............... H04N 5/2251; H04N 5/2252; A61B 1/04–1/055; G03B 17/02; G03B 17/08; G03B 2217/00; G08B 13/19617; G08B 13/19632; G06F 1/1686
USPC ....................................................... 348/373
See application file for complete search history.

(56) References Cited

U.S. PATENT DOCUMENTS

| 5,778,259 A | 7/1998 | Rink |
| 6,507,700 B1 | 1/2003 | Takekuma et al. |
| 7,646,423 B2 | 1/2010 | Yoshida et al. |
| 2004/0251509 A1 | 12/2004 | Choi |

(Continued)

FOREIGN PATENT DOCUMENTS

| EP | 1258764 A2 | 11/2002 |
| EP | 2129104 A2 | 12/2009 |

(Continued)

OTHER PUBLICATIONS

Office Action dated Jan. 4, 2012 in Korean Application No. 10-2010-0108497, filed Nov. 3, 2010.

(Continued)

*Primary Examiner* — Nelson D. Hernández Hernández
(74) *Attorney, Agent, or Firm* — Saliwanchik, Lloyd & Eisenschenk

(57) ABSTRACT

A camera and a method for manufacturing the camera are disclosed, the camera including parts including a lens unit formed with at least one lens for concentrating an image of an outside object, and an image sensor for converting the image of the outside object concentrated in the lens to an electric signal; and a molding unit for exposing the lens of the lens unit and for integrating the parts without any coupling seams.

25 Claims, 2 Drawing Sheets

(56) References Cited

U.S. PATENT DOCUMENTS

2006/0022234 A1* 2/2006 Adair et al. .................. 257/292
2009/0244361 A1* 10/2009 Gebauer et al. ............. 348/373
2010/0098398 A1 4/2010 Dobell et al.
2011/0037886 A1* 2/2011 Singh et al. .................. 348/340

FOREIGN PATENT DOCUMENTS

| JP | 2007-235872 A | 9/2007 |
| JP | 2008-283002 A | 11/2008 |
| KR | 10-1999-0081448 A | 11/1999 |
| KR | 10-2009-0098255 A | 9/2009 |
| KR | 10-2010-0044629 A | 4/2010 |
| TW | 200425722 A | 11/2004 |
| TW | M276221 U | 9/2005 |

OTHER PUBLICATIONS

International Search Report in International Application No. PCT/KR2011/005738, filed Aug. 5, 2011.
Office Action dated Apr. 20, 2015 in Taiwanese Application No. 100128879.
European Search Report dated Jul. 1, 2015 in European Application No. 11838147.4.
Office Action dated Aug. 1, 2016 in European Application No. 11838147.4.

* cited by examiner

CAMERA HAVING A MOLDING UNIT INTEGRATING PARTS AND METHOD FOR MANUFACTURING THE SAME

CROSS-REFERENCE TO RELATED APPLICATIONS

This application is the U.S. national stage application of International Patent Application No. PCT/KR2011/005738, filed Aug. 5, 2011, which claims priority to Korean Application No. 10-2010-0108497, filed Nov. 3, 2010, the disclosures of each of which are incorporated herein by reference in their entirety.

TECHNICAL FIELD

The teachings in accordance with the exemplary embodiments of this invention relate generally to a camera and a method for manufacturing the same.

BACKGROUND ART

Recently, popularization of automobiles enables various strata of people and ages to own automobiles at a fast pace.

Generally, an automobile includes outside rearview mirrors (hereinafter referred to as side mirrors), each formed at a left side and a right side of the automobile, for viewing left/right sides of the automobile when a driver changes a lane, and an inside rearview mirror (hereinafter referred to as a room mirror) formed near a driver seat to obtain a rear view of the automobile.

Furthermore, an automobile includes a rear monitor camera to enable a driver to monitor a dead zone (or blind spot) of an automobile through a screen and to guarantee a safety during backup of the automobile. The rear monitor camera includes various constituent elements further including a housing forming a body of the camera, a camera lens coupled to an inside of the camera and formed with a lens assembly, and a signal processing unit image-signal-processing an optical signal incident to the camera lens to output as an image signal.

The constituent elements are inter-coupled to form a camera body, where a coupled area is inevitably formed with a gap through which dust, foreign objects and moisture permeate. In order to prevent the dust, foreign objects and moisture from permeating, a rubber ring like an O-ring is used, where the O-ring is a must for a camera.

DISCLOSURE OF INVENTION

Technical Problem

The present invention is directed to solve at least one or more of the aforementioned problems in whole or in part and to provide a camera capable of increasing water-tightness efficiency and a method for manufacturing the same.

Technical problems to be solved by the present invention are not restricted to the above-mentioned, and any other technical problems not mentioned so far will be clearly appreciated from the following description by skilled in the art.

Solution to Problem

An object of the invention is to overcome at least one or more of the above problems and/or disadvantages in whole or in part, and/or provide at least the advantages described hereinafter, and/or make improvements in the prior art. In order to achieve at least the above objects, in whole or in part, and in accordance with the purposes of the invention, as embodied and broadly described, and in one general aspect of the present invention, there is provided a camera, the camera comprising: parts including a lens unit formed with at least one lens for concentrating an image of an outside object, and an image sensor for converting the image of the outside object concentrated in the lens to an electric signal; and a molding unit for exposing the lens of the lens unit and for integrating the parts without any coupling seams.

Preferably, the parts further include a PCB (printed circuit board) mounted with the image sensor, and a holder equipped with the lens unit and the PCB.

Preferably, the holder is installed at a rear section of a vehicle.

Preferably, the parts further include a cable unit electrically connected to the PCB.

Preferably, the molding unit is formed on the lens unit, the holder, the PCB and the cable unit.

Preferably, the molding unit is formed on an each partial portion of the lens unit and the cable unit.

Preferably, the PCB includes a first PCB mounted with the image sensor, and a second PCB electrically connected to the first PCB and the cable unit respectively.

Preferably, the cable unit includes a cable electrically connected to the second PCB.

Preferably, material of the molding unit is resin.

Preferably, the image sensor is mounted on the PCB, the PCB is attached to one opened side of a body tube, and the lens unit is equipped with the other opened side of the body tube.

Preferably, the molding unit covers the body tube.

In another general aspect of the present invention, there is provided a method for manufacturing a camera, the method comprising: arranging parts including a lens unit formed with at least one lens for concentrating an image of an outside object, and an image sensor for converting the image of the outside object concentrated in the lens to an electric signal; and exposing the lens of the lens unit and molding the parts.

Preferably, the parts are positioned and arranged on a mold.

Preferably, the step of molding the parts includes molding the parts with resin.

Preferably, an axis of the lens unit and an axis of the image sensor are not molded in the step of molding the parts.

Preferably, the parts further includes a PCB (printed circuit board) mounted with the image sensor, a holder equipped with the lens unit and the PCB, and a cable unit electrically connected to the PCB.

Preferably, an each partial portion of the lens unit and the cable unit is molded in the step of molding the parts.

Preferably, the PCB includes a first PCB mounted with the image sensor, and a second PCB electrically connected to the first PCB and the cable unit respectively.

Preferably, the cable unit includes a cable electrically connected to the second PCB.

Preferably, the image sensor is mounted on the PCB, the PCB is attached to one opened side of a body tube, and the lens unit is equipped with the other opened side of the body tube.

Advantageous Effects of Invention

The exemplary embodiments of the present invention have an advantageous effect in that camera parts are molded with materials of molding unit, free from additional parts such as an O-ring and a gasket, to improve adhesiveness and water-tightness, whereby water-tightness efficiency can be increased by removal of a path through which moisture can permeate.

The exemplary embodiments of the present invention have another advantageous effect in camera parts are integrally molded to decrease the number of parts whereby productivity can be enhanced.

BRIEF DESCRIPTION OF DRAWINGS

The teachings of the present invention can be readily understood by considering the following detailed description in conjunction with the accompanying drawings, in which.

BEST MODE FOR CARRYING OUT THE INVENTION

Figure 1:
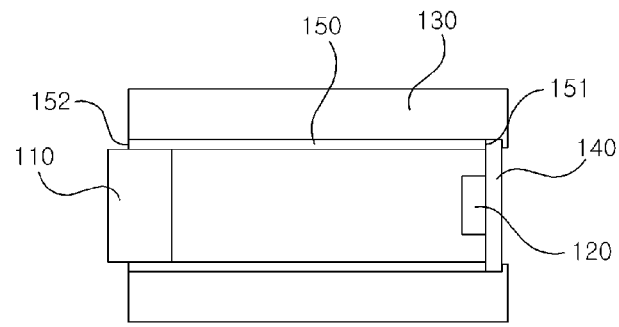
FIG. 1 is a schematic cross-sectional view illustrating a camera according to the present invention.

The following description is not intended to limit the invention to the form disclosed herein. Consequently, variations and modifications commensurate with the following teachings, and skill and knowledge of the relevant art are within the scope of the present invention. The embodiments described herein are further intended to explain modes known of practicing the invention and to enable others skilled in the art to utilize the invention in such, or other embodiments and with various modifications required by the particular application(s) or use(s) of the present invention.

The disclosed embodiments and advantages thereof are best understood by referring to FIGS. 1-7 of the drawings. Other features and advantages of the disclosed embodiments will be or will become apparent to one of ordinary skill in the art upon examination of the following figures and detailed description.

It is intended that all such additional features and advantages be included within the scope of the disclosed embodiments, and protected by the accompanying drawings. Further, the illustrated figures are only exemplary and not intended to assert or imply any limitation with regard to the environment, architecture, or process in which different embodiments may be implemented. Accordingly, the described aspect is intended to embrace all such alterations, modifications, and variations that fall within the scope and novel idea of the present invention.

It will be understood that the terms "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. That is, the terms "including", "includes", "having", "has", "with", or variants thereof may be used in the detailed description and/or the claims to denote non-exhaustive inclusion in a manner similar to the term "comprising".

Furthermore, "exemplary" is merely meant to mean an example, rather than the best. It is also to be appreciated that features, layers and/or elements depicted herein are illustrated with particular dimensions and/or orientation relative to one another for purposes of simplicity and ease of understanding, and that the actual dimensions and/or orientations may differ substantially from that illustrated. That is, in the drawings, the size and relative sizes of layers, regions and/or other elements may be exaggerated or reduced for clarity. Like numbers refer to like elements throughout and explanations that duplicate one another will be omitted.

It will be understood that when an element or layer is referred to as being "on", "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It is to be understood that, as used in the specification and in the claims, the singular forms "a," "an," and "the" include plural referents unless the context clearly dictates otherwise. Thus, for example, reference to "a component surface" includes reference to one or more of such surfaces.

Now, the present invention will be described in detail with reference to the accompanying drawings.

FIG. 1 is a schematic cross-sectional view illustrating a camera according to the present invention.

A camera according to the present invention includes parts including a lens unit (110) formed with at least one lens for concentrating an image of an outside object, and an image sensor (120) for converting the image of the outside object concentrated in the lens to an electric signal; and a molding unit (130) for exposing the lens of the lens unit (110) and for integrating the parts without any coupling seams, where the image sensor (120) is mounted on a PCB (Printed Circuit Board, 140)), the PCB (140) is attached to one opened side (151) of a body tube (150), and the lens unit (110) is equipped with the other opened side (152) of the body tube (150).

Furthermore, the molding unit (130) covers the body tube (150), and material of the molding unit is resin.

Thus, the resin, which is a material of the molding unit, cannot permeate into the body tube, because the lens unit (110) and the image sensor (120) are positioned inside the body tube (150). That is, the resin, which is a material of the molding unit, is not available on an optical axis of the lens unit (110) and an optical axis of the image sensor (120).

Furthermore, the molding unit (130) prevents moisture from permeating into the body tube (150) because the molding unit (130) covers the body tube (150). Therefore, the present invention can advantageously integrate parts using molding to minimize the number of parts, whereby assembly and productivity of camera can be improved.

Another advantage is that a camera can be filled therein with materials of a molding unit to improve adhesiveness and air-tightness, free from additional parts such as an O-ring and a gasket, whereby water-proof efficiency can be increased. Meanwhile, the camera according to the present invention is not limited to FIG. 1, and can be variably embodied with various structures that are molded.

Figure 2:
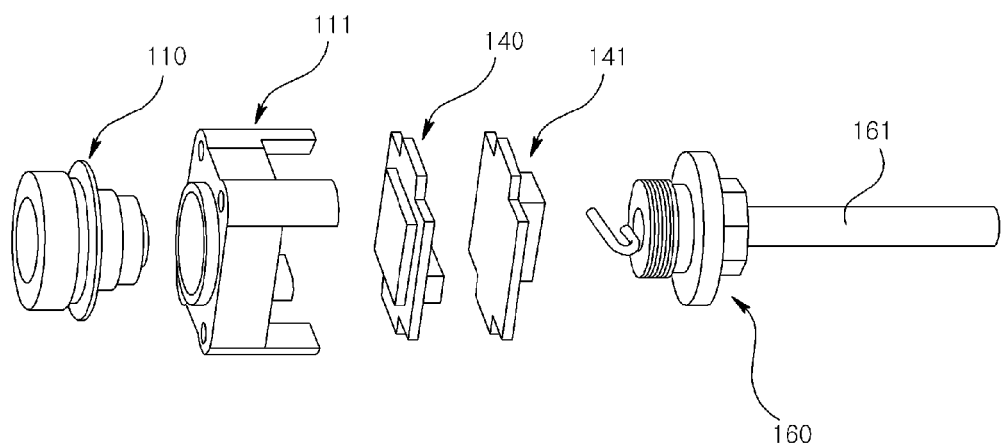
FIG. 2 is a schematic exploded perspective view illustrating a camera prior to molding according to the present invention.

FIG. 2 is a schematic exploded perspective view illustrating a camera prior to molding according to the present invention, where parts of the camera are assembled and molded.

That is, referring to FIG. 2, the parts of the camera may include a lens unit (110), a holder (111), an image sensor (120), PCBs (Printed Circuit Boards, 140, 141) and a cable unit (160), for example, where the lens unit (110), the holder (111), the PCBs (Printed Circuit Boards, 140, 141) and the cable unit (160) are molded. Preferably, the holder (111) is equipped at a rear section of a vehicle. That is, the camera according to the present invention is preferably a back view camera monitoring a rear section of a vehicle.

The lens unit (110) is formed with at least one lens to collect an image of an outside object. The holder (111) is formed with a through hole in which the lens unit (110) is equipped.

The PCBs (140, 141) may include a PCB (140) mounted with the image sensor (120) and a PCB (141) electrically connected to the PCB (140) and the cable unit (160) respectively. The holder (111) may be formed with a guide equipped with the PCBs (140, 141), and the guide is equipped with the PCBs (140, 141). The cable unit (160) includes a cable electrically connected to the PCB (141).

Figure 3:
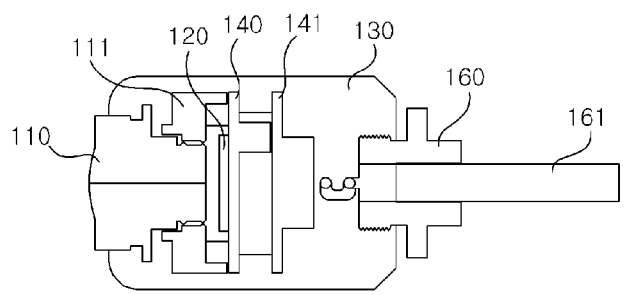
FIG. 3 is a schematic cross-sectional view illustrating a camera after molding according to the present invention.
Figure 4:
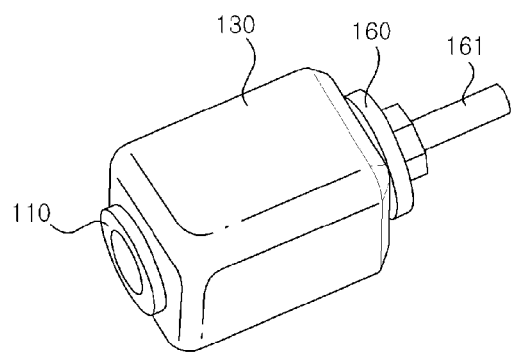
FIG. 4 is a schematic perspective view showing a camera after molding according to the present invention.

FIG. 3 is a schematic cross-sectional view illustrating a camera after molding according to the present invention, and FIG. 4 is a schematic perspective view showing a camera after molding according to the present invention.

As in FIG. 2, parts of the camera, prior to molding, may include a lens unit (110), a holder (111), an image sensor (120), PCBs (Printed Circuit Boards, 140, 141) and a cable unit (160), for example. The holder (111) is equipped with the lens unit (110) and the PCB (140), where the PCBs (140, 141) are electrically connected, and where the PCBs (140, 141) are fixedly positioned. Therefore, the lens unit (110), the holder (111), the PCBs (Printed Circuit Boards, 140, 141) and the cable unit (160) are molded to be integrated with the camera.

At this time, part of the lens unit (110), and parts of the holder (111), the PCBs (Printed Circuit Boards, 140, 141) and the cable unit (160) are covered by the molding unit (130).

In other words, as illustrated in FIG. 4, the molding unit (130) is such that the lens unit (110) is exposed to allow an image of an outside object to pass, and the cable unit (160) to be exposed to the molding unit (130), whereby an electrical signal from the image captured by the camera is transmitted to an outside device through a cable (161) equipped on the cable unit (160).

Figure 5:
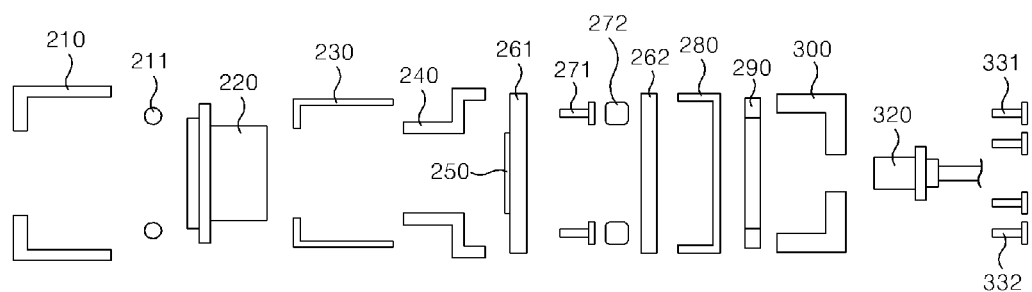
FIG. 5 is a schematic exploded perspective view illustrating parts of a camera in a comparative example of a camera according to the present invention.

FIG. 5 is a schematic exploded perspective view illustrating parts of a camera in a comparative example of a camera according to the present invention.

The camera of the comparative example uses approximately 16 different types of parts including, but not limited to, a front cover (210), an O-ring (211), a lens unit (220), a front shield (230), a holder (240), an image sensor (250), PCBs (261, 262), a first screw (271), a spacer (272), an EMI shield can (280), a gasket (290), a base (300), a cable unit (320) and second and third screws (331, 332).

The camera according to the comparative example is configured in such a manner that the front cover (210) and the base (300) are equipped with the O-ring (211), the lens unit (220), the front shield (230), the holder (240), the image sensor (250), the PCBs (261, 262), the spacer (272), the EMI shield can (280), the gasket (290), the base (300) and the cable unit (320), and secured through the first, second and third screws (271, 331, 332).

Furthermore, the front cover (210) is formed with an opening (not shown) for exposing the lens unit (220), and the lens unit (220) is tightly secured and equipped to the opening. At this time, there is a possibility of the moisture permeating through the front cover (210) and the lens unit (210), such that the O-ring (211) is tightly interposed between the front cover (210) and the lens unit (220).

Still furthermore, the base (300) is formed with an opening (not shown) through which a part of the cable unit (320) and the cable are protruded. Thus, an O-ring (not shown) is also interposed between the base (300) and the cable unit (320) to thereby prevent the moisture from permeating through the base (300) and the cable unit (320).

As noted from the above configuration, the camera according to the comparative example is disadvantageous in that the number of parts increases to increase the manufacturing cost and to complicate the assembling process.

Although the O-ring is disposed to prevent the permeation of moisture into the camera, there is a high probability of the moisture permeating through fine minute gaps formed by interfaces among the front cover (210), the lens unit (220) and the O-ring (211) and by interfaces among the base (300), the cable unit (320) and the O-ring (not shown), and in a case the O-ring (211) becomes worn out in time, the sizes of the gaps become larger to increase the amount of permeating moisture.

In consideration of the abovementioned disadvantages, parts of the camera according to the present invention are integrally molded to enable a reduction in the number of parts and an increase in productivity, and an exterior of the camera is advantageously enclosed by a molded resin to remove a path through which moisture permeates to increase the water-tightness efficiency.

Figure 6:
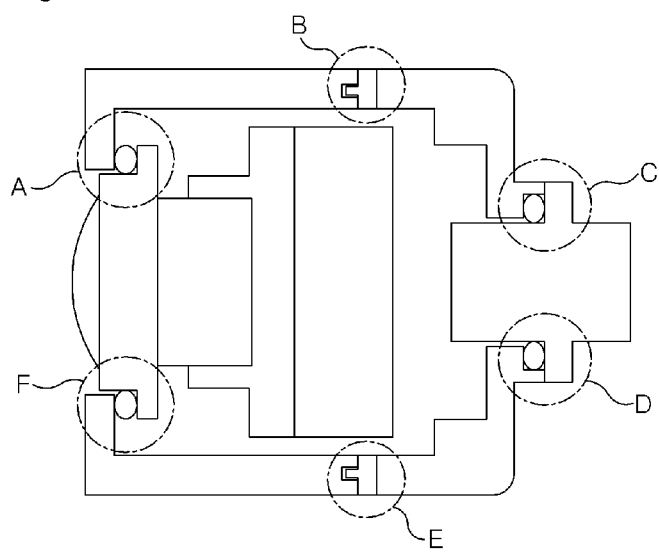
FIG. 6 is a schematic cross-sectional view illustrating a position of an O-ring in an assembled state of a comparative example according to the present invention.

FIG. 6 is a schematic cross-sectional view illustrating a position of an O-ring in an assembled state of a comparative example according to the present invention.

As evidenced from the foregoing, the camera according to the comparative example is formed with an O-ring at a connection area of parts exposed to the outside to prevent moisture from permeating from outside.

That is, as illustrated in FIG. 6, an O-ring is formed at areas (A, F) between the front cover and the lens unit, an O-ring is formed at areas (B, E) between the front cover and the base, and an O-ring is formed at areas (C, D) between the cable unit and the base. Thus, the present invention is advantageous over the comparative example in terms of the number of parts to reduce the manufacturing cost.

MODE FOR THE INVENTION

Figure 7:
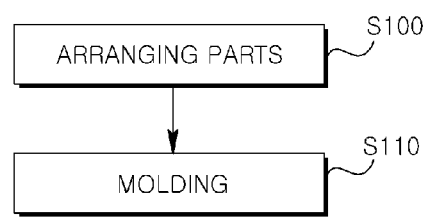
FIG. 7 is a schematic flowchart illustrating a method for manufacturing a camera according to the present invention.

FIG. 7 is a schematic flowchart illustrating a method for manufacturing a camera according to the present invention.

First, parts, including a lens unit formed with at least one lens for concentrating an image of an outside object, and an image sensor for converting the image of the outside object concentrated in the lens to an electric signal, are arranged (S100), where the parts are preferably positioned on a mold and spontaneously arranged on the mold.

That is, the mold includes an upper mold and a bottom mold, between which there is formed a concave unit, the shape of which conforms to that of the parts. Thus, in a case the parts are positioned on the concave unit of the molds, each of the parts is spontaneously arranged on the concave unit. Furthermore, the parts may further include a PCB (printed circuit board) mounted with the image sensor, a holder equipped with the lens unit and the PCB, and a cable unit electrically connected to the PCB.

Thereafter, the lens of the lens unit is exposed to mold the parts (S110). In a case the parts are positioned on the molds, resin is injected into the molds and pressed, whereby the parts are molded. Successively, the camera that is completely molded at the molds is taken out, whereby the manufacturing of the camera according to the present invention is finished.

INDUSTRIAL APPLICABILITY

The present invention has industrial applicability in that camera parts are molded with materials of molding unit to improve adhesiveness and water-tightness, whereby water-tightness efficiency can be increased by removal of a path through which moisture can permeate.

While the present invention has been particularly shown and described with reference to exemplary embodiments thereof, the general inventive concept is not limited to the above-described embodiments. It will be understood by those of ordinary skill in the art that various changes and variations in form and details may be made therein without departing from the spirit and scope of the present invention as defined by the following claims.

The invention claimed is:

1. A camera, the camera comprising:
   parts including a lens unit formed with at least one lens for concentrating an image of an outside object, an image sensor for converting the image of the outside object concentrated in the lens to an electric signal, a first PCB (Printed Circuit Board) having the image sensor mounted on an upper surface thereof, a holder coupled to the lens unit and the first PCB, and a cable unit electrically connected to the first PCB; and
   a molding unit for exposing the lens of the lens unit and for integrating the parts without any coupling seams;
   wherein the molding unit accommodates a portion of the lens unit, the image sensor, the first PCB, the holder, and a portion of the cable unit therein; and
   wherein the lens unit comprises a collar extending radially outward and disposed within the molding unit.

2. The camera of claim 1, wherein the camera is installed at a rear section of a vehicle.

3. The camera of claim 1, wherein the molding unit is formed on the lens unit, the holder, the PCB and the cable unit.

4. The camera of claim 1, further comprising a second PCB electrically connected to the first PCB and the cable unit, wherein the second PCB is disposed between the cable unit and a lower surface of the first PCB.

5. The camera of claim 4, wherein the cable unit includes a cable electrically connected to the second PCB.

6. The camera of claim 1, wherein material of the molding unit is resin.

7. The camera of claim 1, wherein the PCB is attached to one opened side of a body tube, and the lens unit is equipped with the other opened side of the body tube.

8. The camera of claim 7, wherein the molding unit covers the body tube.

9. The camera of claim 1, wherein the holder comprises:
   a square-shaped upper plate portion with a hole formed therethrough for receiving the lens unit; and
   four leg portions respectively formed at corners of the upper plate portion, each leg portion extending downwardly away from the upper plate portion in a direction perpendicular to an upper surface of the upper plate portion.

10. The camera of claim 9, wherein the first PCB is disposed under the upper plate portion of the holder and to a side of each of the leg portions.

11. The camera of claim 1, wherein the molding unit accommodates a majority of the lens unit therein, and wherein a portion of the lens unit is exposed out of the molding unit such that the lens unit extends beyond an outer surface of the molding unit.

12. The camera of claim 1, wherein the lens unit comprises a barrel having the collar.

13. The camera of claim 1, wherein the collar extends more radially outward than any other portion of the lens unit.

14. A method for manufacturing a camera, the method comprising:
   arranging parts including a lens unit formed with at least one lens for concentrating an image of an outside object, an image sensor for converting the image of the outside object concentrated in the lens to an electric signal, a first PCB (Printed Circuit Board) mounted with the image sensor, a holder coupled to the lens unit and the first PCB, and a cable unit electrically connected to the first PCB; and
   exposing the lens of the lens unit and molding the parts including a portion of the lens unit, the holder, the first PCB, and a portion of the cable unit;
   wherein the lens unit comprises a collar extending radially outward, wherein the collar is disposed at the portion of the lens unit that is molded during the step of molding the parts.

15. The method of claim 14, wherein the parts are positioned and arranged on a mold.

16. The method of claim 14, wherein the step of molding the parts includes molding the parts with resin.

17. The method of claim 14, wherein an axis of the lens unit and an axis of the image sensor are not molded in the step of molding the parts.

18. The method of claim 14, wherein the PCB is attached to one opened side of a body tube, and the lens unit is equipped with the other opened side of the body tube.

19. The method of claim 14, wherein the image sensor is mounted on an upper surface of the first PCB, wherein the parts further include a second PCB disposed between the cable unit and a lower surface of the first PCB, and wherein the second PCB is electrically connected to the first PCB and the cable unit.

20. The method of claim 19, wherein the cable unit includes a cable electrically connected to the second PCB.

21. The method of claim 19, wherein the holder comprises:
   a square-shaped upper plate portion with a hole formed therethrough for receiving the lens unit; and
   four leg portions respectively formed at corners of the upper plate portion, each leg portion extending downwardly away from the upper plate portion in a direction perpendicular to an upper surface of the upper plate portion.

22. The method of claim 21, wherein the first PCB is disposed under the upper plate portion of the holder and to a side of each of the leg portions.

23. The method of claim 14, wherein the lens unit comprises a barrel having the collar.

24. The method of claim 14, wherein the collar extends more radially outward than any other portion of the lens unit.

25. The method of claim 14, wherein, prior to molding the parts, the first PCB and the holder are uncoupled, such that the molding step couples the first PCB to the holder.

\* \* \* \* \*